United States Patent
Eldridge et al.

(10) Patent No.: US 10,374,369 B2
(45) Date of Patent: Aug. 6, 2019

(54) TESTING AND MONITORING OF AN ELECTRICAL CONNECTION

(71) Applicants: David Austin Eldridge, Knoxville, TN (US); Maximilian Abel Mueller, Knoxville, TN (US); Ronald Lee Thompson, Knoxville, TN (US); Charles John Luebke, Hartland, WI (US)

(72) Inventors: David Austin Eldridge, Knoxville, TN (US); Maximilian Abel Mueller, Knoxville, TN (US); Ronald Lee Thompson, Knoxville, TN (US); Charles John Luebke, Hartland, WI (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 294 days.

(21) Appl. No.: 14/757,614

(22) Filed: Dec. 23, 2015

(65) Prior Publication Data
US 2016/0178682 A1 Jun. 23, 2016

Related U.S. Application Data

(60) Provisional application No. 62/096,234, filed on Dec. 23, 2014.

(51) Int. Cl.
*H01R 13/713* (2006.01)
*G01R 31/04* (2006.01)
(Continued)

(52) U.S. Cl.
CPC ......... *H01R 13/713* (2013.01); *G01R 31/045* (2013.01); *G01R 31/088* (2013.01); *H01R 13/665* (2013.01)

(58) Field of Classification Search
CPC ... G01V 3/18; G01V 1/52; G01V 3/34; G01V 3/38; G01V 5/04
(Continued)

(56) References Cited

U.S. PATENT DOCUMENTS

| 4,234,926 A | 11/1980 | Wallace et al. |
| 4,525,715 A * | 6/1985 | Smith ............... E21B 47/122 |
| | | 175/50 |

(Continued)

FOREIGN PATENT DOCUMENTS

| GB | 2204198 | 11/1988 |
| JP | 2002318047 | 10/2002 |
| WO | 2010119093 | 10/2010 |

OTHER PUBLICATIONS

Machine translation of abstract of JP2002318047, via Espacenet, 2 pages.
(Continued)

*Primary Examiner* — Giovanni Astacio-Oquendo
(74) *Attorney, Agent, or Firm* — King & Spalding LLP

(57) ABSTRACT

A system and method for testing of electrical connections, conductors, and loads prior to energizing those connections is disclosed. For example, an interlocking socket can comprise a receptacle designed to be coupled to a connector of a load. The interlocking socket can comprise a microprocessor coupled to the receptacle, the microcontroller operable for testing one or more faults in the connector, a conductor, or the load coupled to the connector. In another example, a microprocessor can be coupled to a switch comprising a conductor, where the microprocessor is operable for testing one or more faults in the conductor or a load coupled to the conductor.

17 Claims, 17 Drawing Sheets

(51) Int. Cl.
*G01R 31/08* (2006.01)
*H01R 13/66* (2006.01)

(58) Field of Classification Search
USPC .................. 324/333, 334, 338, 339, 346
See application file for complete search history.

(56) References Cited

U.S. PATENT DOCUMENTS

| | | | |
|---|---|---|---|
| 4,604,505 A | 8/1986 | Henninger | |
| 4,885,564 A | 12/1989 | Vercellotti et al. | |
| 5,268,644 A | 12/1993 | Klassen et al. | |
| 5,469,064 A | 11/1995 | Kerschner et al. | |
| 5,552,701 A | 9/1996 | Veteran et al. | |
| 5,737,168 A | 4/1998 | Baker | |
| 5,903,718 A | 5/1999 | Marik | |
| 5,946,180 A | 8/1999 | Simpson | |
| 6,006,844 A * | 12/1999 | Van Puymbroeck | ... E21B 10/02 175/246 |
| 6,351,827 B1 | 2/2002 | Co et al. | |
| 6,516,053 B1 | 2/2003 | Ryan et al. | |
| 6,807,035 B1 | 10/2004 | Baldwin et al. | |
| 6,970,534 B1 | 11/2005 | Brumble | |
| 6,992,491 B1 | 1/2006 | Lo et al. | |
| 7,143,659 B2 * | 12/2006 | Stout | ......... F17D 5/00 324/71.2 |
| 7,462,957 B2 | 12/2008 | Camwell et al. | |
| 7,526,971 B2 * | 5/2009 | Mandziuk | ........ F16L 55/38 73/866.5 |
| 7,665,542 B2 * | 2/2010 | Stockton | ......... E21B 25/00 175/244 |
| 8,284,066 B2 | 10/2012 | Perten et al. | |
| 8,475,192 B2 | 7/2013 | Kantor | |
| 9,525,247 B2 | 12/2016 | Seff et al. | |
| 2001/0050559 A1 * | 12/2001 | Wisler | ......... E21B 25/00 324/377 |
| 2002/0097546 A1 | 7/2002 | Weinberger | |
| 2007/0076334 A1 | 4/2007 | Battani et al. | |
| 2009/0228155 A1 | 9/2009 | Slifkin et al. | |
| 2010/0000792 A1 * | 1/2010 | Alberty | ........ E21B 47/026 175/50 |
| 2011/0001486 A1 | 1/2011 | Abouda et al. | |
| 2011/0320056 A1 | 12/2011 | Brown et al. | |
| 2012/0206100 A1 | 8/2012 | Brown et al. | |
| 2013/0001052 A1 | 1/2013 | Kantor | |
| 2013/0065416 A1 | 3/2013 | Kantor | |
| 2013/0162262 A1 | 6/2013 | Johnson et al. | |
| 2013/0182361 A1 | 7/2013 | Sexton et al. | |
| 2013/0207455 A1 | 8/2013 | Doljack | |
| 2014/0077821 A1 | 3/2014 | Reed et al. | |
| 2014/0244058 A1 | 8/2014 | Zweigle et al. | |
| 2015/0316600 A1 | 11/2015 | Davis | |
| 2017/0110872 A1 | 4/2017 | Saarinen et al. | |
| 2018/0087867 A1 * | 3/2018 | Tower | .................. F16B 21/165 |
| 2018/0323549 A1 * | 11/2018 | Vogel | .................. H01R 13/514 |
| 2018/0339377 A1 * | 11/2018 | Schneeberger | ......... F16B 39/24 |

OTHER PUBLICATIONS

A. Semenova, International Search Report and Written Opinion issued in PCT/US2017/020472, completion date May 28, 2017, dated Jun. 8, 2017, 6 pages, Federal Institute of Industrial Property, Moscow, Russia.

A. Semenova, International Search Report and Written Opinion issued in application PCT/US2017/041368, completion date Oct. 26, 2017, dated Nov. 9, 2017, 7 pages, Federal Institute of Industrial Property, Moscow, Russia.

Zhao Xue, Written Opinion issued in Singapore Patent Application No. 11201705658W, dated Apr. 12, 2018, 7 pages, Intellectual Property Office of Singapore, Singapore.

Partial Supplemental European Search Report under Rule 164, paragraph 1 of the European Patent Convention issued in EP15873771, dated Oct. 15, 2018, pp. 1-15, European Patent Office, Munich, Germany.

Semenova, A., International Search Report and Written Opinion of the International Searching Authority for PCT/US2016/066568, completion dated Mar. 15, 2017, dated Apr. 13, 2017, pp. 1-7, Federal Institute of Industrial Property, Moscow, Russia.

E. Ushakova, International Search Report and Written Opinion issued in International Application No. PCT/US2015/000213, completion dated May 24, 2016, dated Jun. 2, 2016, 7 pages, Federal Institute of Industrial Property, Moscow, Russia.

Singapore Search Report issued in patent application No. 11201805516W, dated Feb. 21, 2019, 8 pages Intellectual Property Office of Singapore.

Supplementary European Search Report issued in EP Application No. 15873771 dated Jan. 31, 2019, 14 pages.

EP 14166466 .4 to provide priority for US 2017/0110872. dated Apr. 29, 2014. (Year: 2014).

* cited by examiner

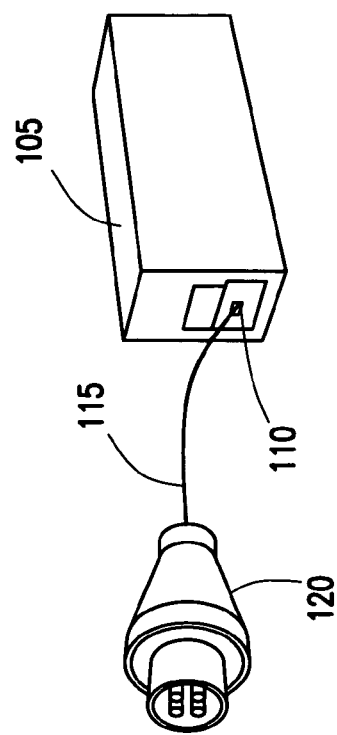
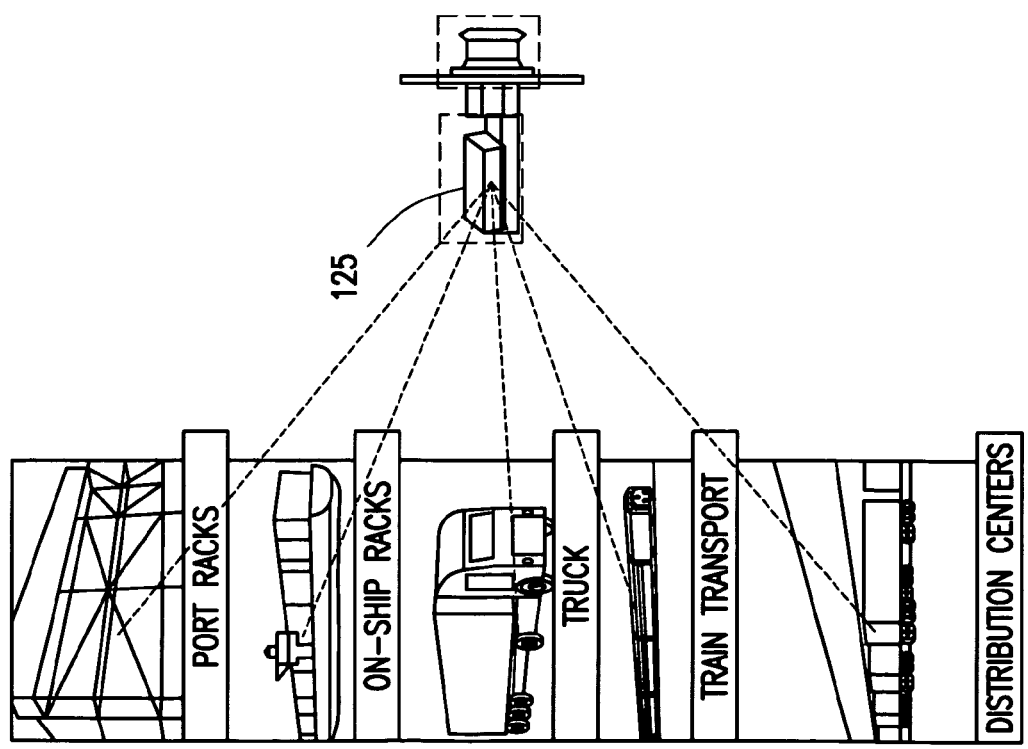
FIG. 1
(PRIOR ART)

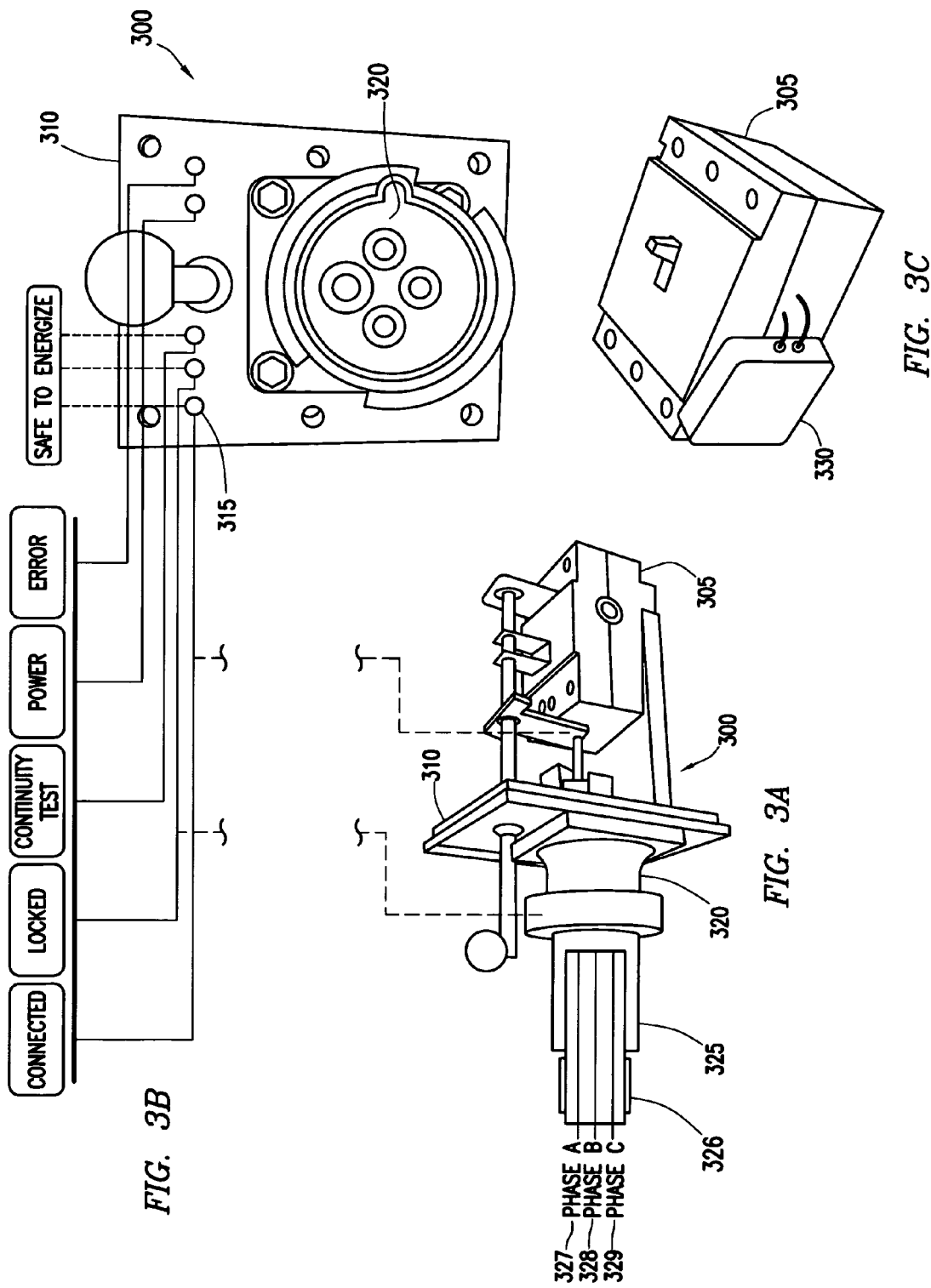

| | FUNCTION |
|---|---|
| 1 | SENSE SHORT BETWEEN PHASES |
| 2a | DETECT GF BEFORE APPLYING POWER (IMPEDANCE OF PHASE TO GROUND) |
| 2b | DETECT GF AFTER APPLYING LOAD (W/ SELFTEST) |
| 3a | GROUND ASSURANCE (SOURCE) CHECK |
| 3b | GROUND CONTINUITY (LOAD) CHECK |
| 4a | SENSE OPEN BEFORE APPLYING POWER |
| 4b | SENSE OPEN AFTER APPLYING POWER |
| 5 | ARC FAULT DETECTION |
| 6 | HIGH TEMP PLUG CONNECTOR PINS |
| 7 | CONTACTOR/BREAKER CONTROL AND AUX CONTACT FEEDBACK |

*FIG. 8B*

TESTING AND MONITORING OF AN ELECTRICAL CONNECTION

RELATED APPLICATION

The present application claims priority to and incorporates by reference in its entirety U.S. Provisional Patent Application No. 62/096,234, filed on Dec. 23, 2014, and titled "Testing and Monitoring of an Electrical Connection."

TECHNICAL FIELD

Embodiments of the invention relate generally to electrical connections, and more particularly, to testing of electrical connections, conductors, and loads prior to energizing those connections.

BACKGROUND

Portable devices often contain components requiring electrical power and in some cases the required electrical power can have relatively high voltage and current ratings. Receptacles have been designed to provide power to such portable devices. Often, receptacles are designed with mechanical interlocking features to ensure that a connector from the device is properly inserted into the receptacle. However, as described further below, such mechanical interlocking features do not typically provide electrical testing features.

Refrigerated shipping containers are one example of a portable device that requires power. Refrigerated shipping containers are used to ship goods throughout the world. Such refrigerated shipping containers can be transported on trains, trucks and ships and the containers are often stationed at ports, warehouses, and distribution centers. While the refrigerated containers are located in these various modes of transportation and storage, they often need electrical power to operate the refrigeration unit of the container. The refrigeration units in refrigerated shipping containers typically operate at relatively high voltage and current ratings. For example, many refrigerated shipping containers operate at 480 volts AC and 32 amps. Electricity is delivered to refrigerated shipping containers via receptacles that can be found, for example, in ports and distribution centers and on ships, trains, and trucks.

As shown in FIG. 1, an example refrigerated shipping container 105 can include a refrigeration unit 110 with a power cord 115 and a connector 120. The connector 120 can have a variety of configurations. In the example shown in FIG. 1, the connector 120 is a pin-and-sleeve type of connector with four pins. The connector 120 of refrigerated shipping container 105 can connect to a socket comprising a receptacle such as the reefer receptacle 125 shown in FIG. 1. In some instances, the socket can be an interlocking socket. Interlocking sockets provide added safety in that they require a secure mechanical connection between the receptacle and the connector before the receptacle is energized and power is delivered to the connector 120. Examples of interlocking sockets are described further, for example, in U.S. Pat. Nos. 4,604,505, 8,475,192, and U.S. Patent Application Publication No. 20130001052.

While existing interlocking sockets, such as the one comprising reefer receptacle 125 shown in FIG. 1, provide a mechanical interlock with the connector, they do not provide any information regarding the safety of the electrical connection beyond the receptacle, including the connector or any conductors or electrical equipment downstream of the connector. For example, because the connector and power cord remain attached to the refrigerated shipping container while it is transported and stored, it is common for the connector and/or the power cord to become damaged. As illustrated further in FIG. 2C, damage to the connector and/or the power cord can produce an unsafe condition, such as a bolted fault or ground fault, when a damaged connector 220 is connected to a receptacle and energized. Unsafe electrical conditions can also arise downstream of the power cord at the compressor or other electrical components of the refrigeration system. Such unsafe conditions can be exacerbated in situations where refrigerated shipping containers are stored in racks closer to the main incoming electrical source where a higher short circuit current exists. As illustrated in FIGS. 2A and 2B, some ports and shipping areas are transitioning from horizontal reefer runways 205 shown in FIG. 2A, where reefers are placed adjacent to each other on the ground, to reefer racks 210 shown in FIG. 2B, where reefers are stacked vertically in a more dense arrangement that is closer to the incoming power source. The more dense arrangements involving reefer racks can increase the possibility of unsafe electrical conditions that could produce arcing.

Accordingly, there is a need for an improved receptacle that can alert users to unsafe electrical conditions in the connector, power cord, or electrical components downstream of the connector and power cord towards and including the load. There is a further need for an improved receptacle that prevents the receptacle from being energized when an unsafe electrical condition is detected.

While the solution described in the following text and the attached figures largely focuses on examples of improved receptacles for use with refrigerated shipping containers, those in the field will recognize that the improved receptacles can be used in other applications. The improved receptacles described herein can be useful in providing electrical power to any device. Furthermore, the embodiments described herein can be applied to other electrical devices including switches and indicators.

SUMMARY

The present application relates to testing and monitoring of an electrical connection. In one embodiment, the disclosure provides for an interlocking socket for coupling to a connector of a load, wherein the interlocking socket comprises a receptacle designed to receive the connector. The interlocking socket further comprises a microcontroller coupled to the receptacle, the microcontroller operable for testing for one or more faults in the connector, a conductor, or the load coupled to the connector. The interlocking socket can include a switching device (such as a breaker, safety disconnect switch, relay, starter, contactor, etc.) that can be controlled by the microcontroller to provide a direct safety interlock to disconnect a power circuit or maintain the power circuit in a disconnected state so that power is not delivered to the load when an unsafe condition is detected.

In another embodiment, the disclosure provides for a microcontroller coupled to a switching device, wherein the switching device can include a breaker, safety disconnect switch, relay, starter, contactor, or any other type of switch known to those in this field, that is manually operated. The microcontroller is operable for testing for one or more faults in a conductor coupled to the switching device or a load that can be coupled to the switching device. If the microcontroller detects a fault or unsafe condition, the microcontroller can actuate an indicator which indicates that the switch should not be activated.

These and other aspects, objects, features, and embodiments will be apparent from the following description and the appended claims.

BRIEF DESCRIPTION OF THE FIGURES

Reference will now be made to the accompanying drawings, which are not necessarily drawn to scale, and wherein:

FIG. 1 illustrates an example of a typical refrigerated shipping container and a prior art reefer receptacle;

FIGS. 3A, 3B, and 3C illustrate an improved receptacle in accordance with an example embodiment of the present disclosure;

FIG. 8B provides a table showing the different testing functions that the microcontroller can perform in accordance with an example embodiment;

Figure 2A:
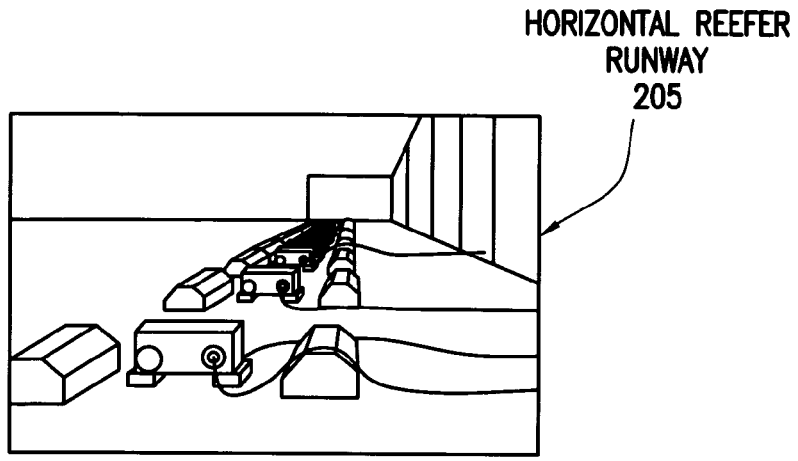
FIGS. 2A, 2B, and 2C illustrate certain limitations with prior art reefer receptacles.
Figure 2B:
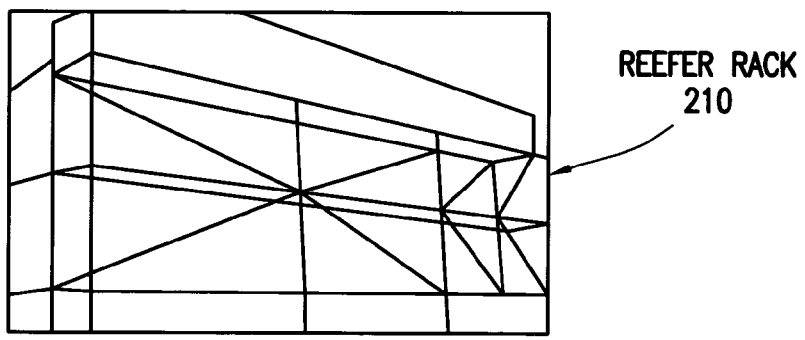
Figure 2C:
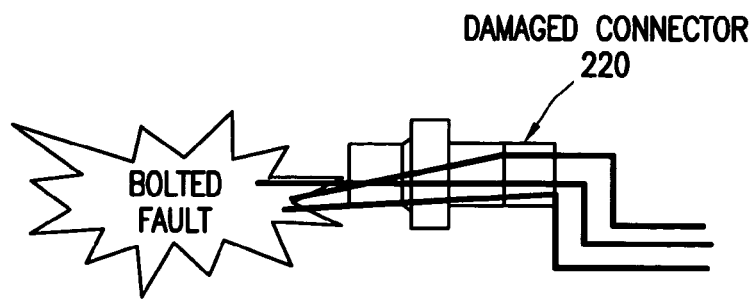

The drawings illustrate only example embodiments of the invention and are therefore not to be considered limiting of its scope, as the invention may admit to other equally effective embodiments. The elements and features shown in the drawings are not necessarily to scale, emphasis instead being placed upon clearly illustrating the principles of the example embodiments. Additionally, certain dimensions or positionings may be exaggerated to help visually convey such principles. In the drawings, reference numerals designate like or corresponding, but not necessarily identical, elements.

DETAILED DESCRIPTION OF EXAMPLE EMBODIMENTS

Example embodiments disclosed herein are directed to systems and methods for an improved receptacles, switching devices and indicators. Example embodiments are described herein with reference to the attached figures, however, these example embodiments are not limiting and those skilled in the art will appreciate that various modification are within the scope of this disclosure.

In one or more of the example embodiments, improved receptacles, switching devices and indicators may be subject to meeting certain industry standards or requirements. Examples of entities that set and/or maintain such standards can include, but are not limited to, the International Electrotechnical Commission (IEC), the National Electric Code (NEC), the National Electrical Manufacturers Association (NEMA), and the Institute of Electrical and Electronics Engineers (IEEE). Example embodiments are designed to be used in compliance with any applicable standards and/or regulations.

Any of the example receptacles, switches or indicators and their associated components or portions (e.g., features) thereof, described herein can be made from a single piece or component (as from a single integrated circuit). Alternatively, the example receptacles, switches or indicators (or portions thereof) can be made from multiple pieces or components. Also, the names given to various components described herein are descriptive of one embodiment and are not meant to be limiting in any way. Those of ordinary skill in the art will appreciate that a feature and/or component shown and/or described in one embodiment (e.g., in a figure) herein can be used in another embodiment (e.g., in any other figure) herein, even if not expressly shown and/or described in such other embodiment.

Any component described in one or more figures herein can apply to any subsequent figures having the same label. In other words, the description for any component of a subsequent (or other) figure can be considered substantially the same as the corresponding component described with respect to a previous (or other) figure. The numbering scheme for the components in the figures herein parallel the numbering scheme for corresponding components described in another figure in that each component is a three digit number having the identical last two digits. For any figure shown and described herein, one or more of the components may be omitted, added, repeated, and/or substituted. Accordingly, embodiments shown in a particular figure should not be considered limited to the specific arrangements of components shown in such figure.

Referring to the example embodiments shown in the figures, FIGS. 3A, 3B, and 3C show various views of an example embodiment of the improved interlock socket 300. The example improved interlock socket 300 includes the components typically found in a conventional interlock socket including a faceplate 310 and a molded case circuit breaker 305 mounted on a tray with electrical connections to a receptacle 320. In the example shown in FIG. 3A, a connector 325, such as a connector to a refrigerated shipping container or other device requiring power, is inserted into the receptacle 320. Example connector 325 is attached to power cord 326 which includes three power cord conductors, 327, 328, and 329, each carrying a different phase of power. The improved interlock socket 300 also includes a microcontroller 330 for performing safety testing of the electrical connections, power cord conductors, and load before closing the circuit breaker and energizing the circuit. The microcontroller 330 is shown in FIG. 3C mounted to the exterior of the circuit breaker 305. However, in alternate embodiments, the microcontroller can be mounted in an accessory cavity within the circuit breaker 305.

As described further in the figures that follow, the microcontroller 330 provides the ability to test the electrical connections and conductors between the receptacle, the connector, the power cord, and the electrical components downstream of the power cord towards and including the load to ensure there are no faults or other unsafe electrical conditions prior to closing the breaker and energizing the circuit. The microcontroller can also control the operation of the circuit breaker or similar switching device such that if an unsafe condition is detected, the circuit breaker cannot be closed and the circuit cannot be energized. The results of the tests performed by the microcontroller 330 can be communicated to a user via one or more indicators, such as the indicators 315 shown on the faceplate 310 in FIG. 3B. FIG. 3B provides a front view of the interlock socket 300 and receptacle 320 with the connector 325 removed. In the example in FIG. 3B, an indicator can signal that the connector is properly connected to the receptacle. Another indicator can signal that there are no faults detected in the circuit. Finally, yet another indicator can signal that the breaker is closed and power is being delivered to the circuit. In other embodiments different arrangements of indicators, including visual and audible indicators, can be implemented to communicate the results of the tests performed by the microcontroller 330. Additionally, as described further in connection with FIGS. 9-11, the microcontroller can communicate the results of the tests it performs to remote locations, such as a central monitoring system of a port.

Figure 4A:
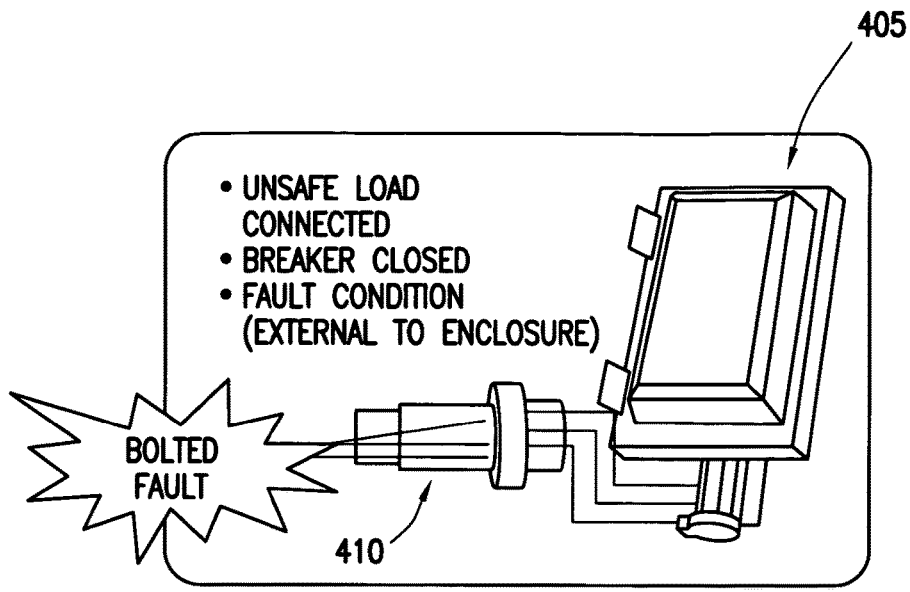
FIG. 4A illustrates another example of a prior art receptacle.
Figure 4B:
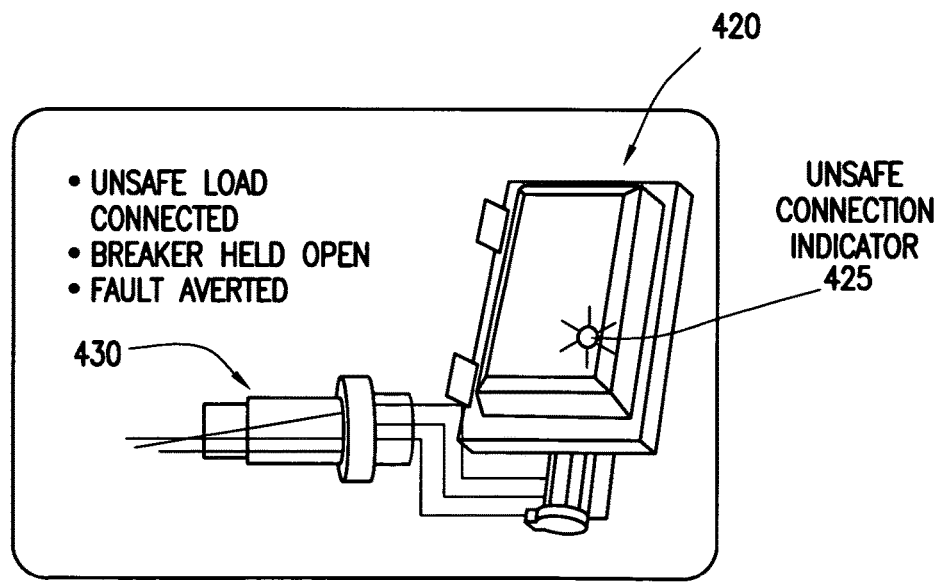
FIG. 4B illustrates another application of an improved receptacle in accordance with an example embodiment.

Referring now to FIGS. 4A and 4B, another example of a prior art receptacle is shown in FIG. 4A, whereas an improved receptacle with a microcontroller is shown in FIG. 4B. FIGS. 4A and 4B illustrate that the improved receptacle described herein can be applied to other types of receptacles beyond the interlock socket illustrated in FIGS. 3A-3C. For example, FIGS. 4A and 4B illustrate an enclosure 405, 420 with an interlock socket that may be mounted, for example to a wall, and may be used in a hazardous environment that requires explosion-proof equipment. The components of the interlock socket are located inside the enclosure 405, 420 in FIGS. 4A and 4B and are not visible, but are generally understood to those in this field. The interlock socket shown in FIGS. 4A and 4B typically includes a breaker and a receptacle into which a connector can be inserted. As illustrated in the prior art example in FIG. 4A, if the connector 410 or other component downstream of the connector contains a fault or other unsafe condition, the prior art interlock socket is unable to test for such a fault or other unsafe condition before the breaker is closed and power is supplied to the connector 410.

In contrast, the improved enclosure 420 shown in FIG. 4B can also implement a microcontroller (located within the enclosure 420) similar to microcontroller 330, to test the electrical connection between the receptacle, the connector 430, the power cord, and downstream electrical components, including the load, before the circuit is energized. If the microcontroller detects a fault or other unsafe condition in the receptacle, the connector, the power cord, or downstream electrical components, the microcontroller can prevent a breaker within the enclosure 420 from closing and thereby prevent power from being delivered to the connector. In addition, the enclosure 420 can include an indicator, such as indicator 425 located on the exterior of the enclosure 420. The indicator can provide an indication when the microcontroller has detected an unsafe condition and is preventing the breaker from being closed.

Those of skill in this field will recognized that the microcontroller described in connection with FIGS. 3A-3C and 4B can be applied to other types of enclosures in both hazardous and non-hazardous environments. For example, instead of the previously described receptacle, enclosure 420 could contain a manual switching device, such as a safety disconnect switch, a relay, a starter, a contactor, or any other type of switch known to those in this field. As with the foregoing example, the manual switch can include a microcontroller that performs testing on the connector and downstream components and indicates test results or status before the manual switch is actuated and the connector is energized.

Figure 5:
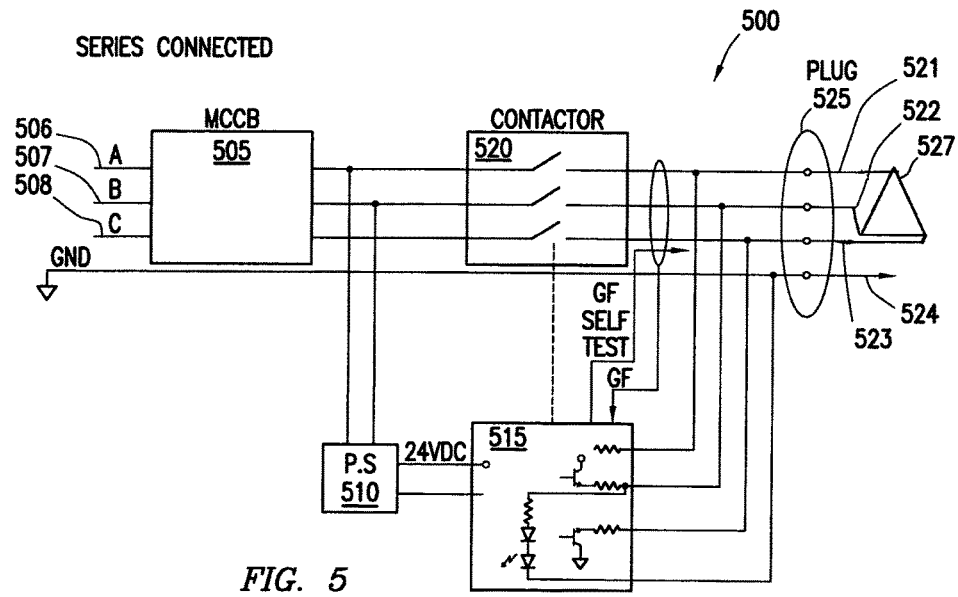
FIG. 5 illustrates a block diagram showing the components of an example embodiment of an improved receptacle in accordance with the present disclosure.
Figure 6A:
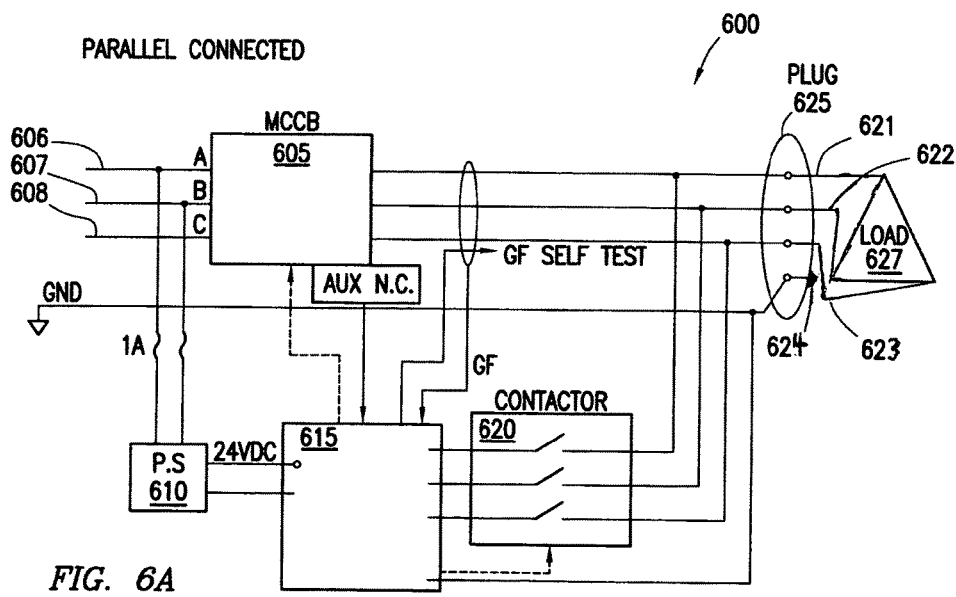
FIG. 6A illustrates a block diagram showing the components of another example embodiment of an improved receptacle in accordance with the present disclosure.

Referring now to FIGS. 5 and 6A, two different implementations of the microcontroller are illustrated. FIG. 5 illustrates the microcontroller 515 and contactor 520 implemented in series between the circuit breaker 505 and the plug or connector 525. The microcontroller 515 can receive power for performing testing operations via a power source, such as the 24 V DC power source 510. The 24 V DC power source 510 is merely one example and in other embodiments other power sources that may be AC or DC and having different voltages can be employed. The microcontroller 515 performs testing by transmitting signals onto each of the four conductors (three discrete phase conductors 521, 522, and 523 and a ground conductor 524) of the plug or connector 525 that connects via a power cord to a load 527. The microcontroller can also include a coil (GF) for ground fault testing as well as a temperature sensor for detecting temperature increases that may indicate an unsafe condition. If the microcontroller detects an unsafe electrical condition via any of the tests that are performed, the microcontroller can lock the contactor 520 so that power cannot be delivered to the plug 525. In the implementation shown in FIG. 5, the contactor 520 must be rated to handle the voltage and current conducted from the line conductors 506, 507, and 508 to the plug once the breaker 505 and contactor 520 are closed.

FIG. 6A shows an alternate embodiment 600 wherein the microcontroller 615 and contactor 620 are implemented in parallel to the breaker 605. In the example 600, the microcontroller 615 receives power from a power source such as the 24 V DC power source 610 and transmits test signals on the four conductors (three discrete phase conductors 621, 622, and 623 and a ground wire 624) of the plug or connector 625 via the contactor 620. The plug or connector 625 is coupled via a power cord to a load 627. The microcontroller can also include a coil (GF) for performing ground fault testing as well as a temperature sensor for detecting temperature increases that may indicate an unsafe condition. Lastly, the microcontroller can be coupled to the breaker 605 and can prevent the breaker from closing if an unsafe condition is detected. If microcontroller determines that the electrical conditions are safe based on the tests performed, the breaker 605 can be closed and so that power from the line conductors 606, 607, and 608 can be supplied to the load 627. The example shown in FIG. 6 offers advantages over the example shown in FIG. 5 in that the contactor 620 is not required to be as robust as the contactor 520 because contactor 620 is not conducting the full current to the plug. The contactor 620 also provides electrical isolation of the microcontroller 615 from the high voltage of the power conductors when they are energized, so low voltage detection circuitry can be used.

Figure 6B:
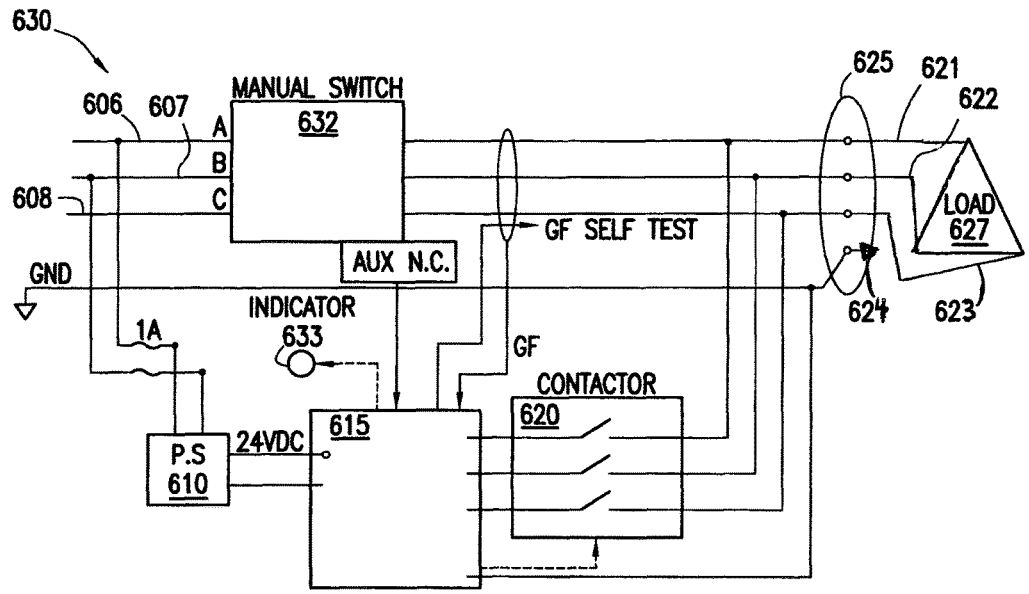
FIG. 6B illustrates a block diagram showing the components of another example embodiment implemented with a manual switch in accordance with the present disclosure.

In connection with the embodiments illustrated in FIGS. 6A, 6B, 6C, and 6D, the same reference numbers used in the different figures indicates the same or similar components are used in each embodiment unless otherwise noted. Referring now to FIG. 6B, an alternate embodiment 630 is illustrated showing an example microcontroller 615 implemented in a different system. Specifically, instead of a breaker as illustrated in FIG. 6A, the example 630 shown in FIG. 6B includes a manual switch 632 and an indicator 633. The manual switch 632 can be any type of switching device known to those in this field, including a relay, a starter, or a contactor. The manual switch 632 also comprises a connector 625 that couples to a load 627. In the example system of 630, the connector 625 is a three-phase conductor with three discrete conductors 621, 622, and 623 and a ground conductor 624. When the manual switch 632 is closed, power is delivered to the load 627 via the connector 625. Example system 630 shown in FIG. 6B uses microcontroller 615, power source 610, and contactor 620 in a similar manner as that described in connection with FIG. 6A in order to detect faults or other unsafe conditions in the connector 625 or downstream of the connector 625 to a load. However, instead of a breaker that the microcontroller 615 can control to prevent the energizing of the load, the microcontroller 615 actuates indicator 633 to indicate an unsafe condition. The indicator 633 can be any type of indicator including a visual indicator and an audible indicator. The actuated indicator provides a signal to a user that actuating the manual switch to energize the load 627 may be unsafe due to one or more conditions detected by the microcontroller 615. In yet another variation on the embodiment shown in FIG. 6B, the manual switch 632 can be removed and the microcontroller 615 and indicator 633 can perform a monitoring and alerting function.

Referring again to the embodiments shown in FIGS. 5 and 6A that include a breaker, in certain examples there may be a need for communication with the load, such as a refrigerated container. However, when the breaker is open in the power circuits illustrated in FIGS. 5 and 6A, communication over the power circuit is not possible. Therefore, FIGS. 6C and 6D provide further example embodiments that support communication via the power circuit with the load, such as a refrigerated container, when the breaker is open.

Figure 6C:
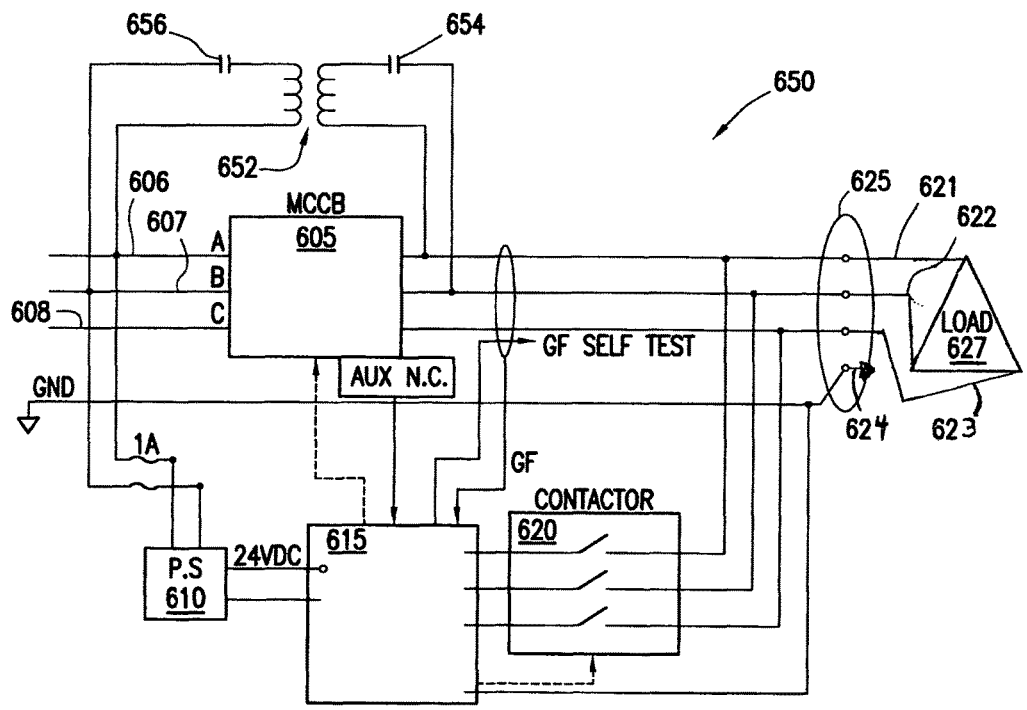
FIG. 6C illustrates a block diagram showing the components of another example embodiment with power line communication capability in accordance with the present disclosure.
Figure 6D:
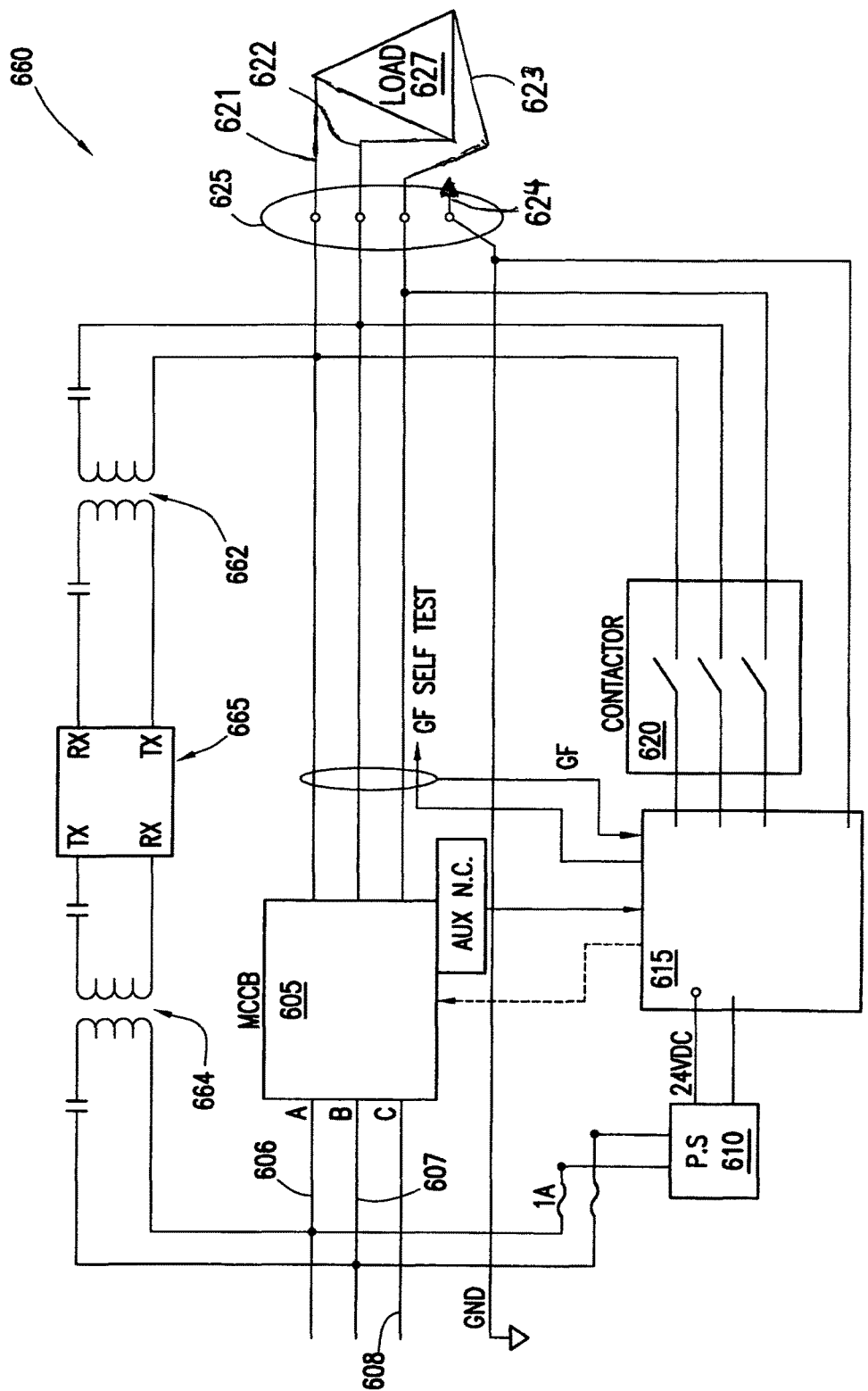
FIG. 6D illustrates a block diagram showing the components of another example embodiment.

FIG. 6C provides an example of passive power line communication, whereas FIG. 6D provides an example of active power line communication. FIGS. 6C and 6D both include a breaker 605, a power supply 610, a microcontroller 615, a contactor 620, and a connector 625 and these components operate in a similar manner to that described in connection with FIG. 6A. In addition to these components, FIG. 6C includes a passive power line communication module 650. The passive power line communication module 650 comprises a signal transformer 652 that is coupled via capacitors 654 and 656 to the interlocking socket. One side of the passive power line communication module 650 is coupled to phase A and B conductors 621 and 622 on the receptacle side of the breaker 605 and the other side of the module 650 is coupled to the phase A and B line conductors 606 and 607 on the power line side of the breaker 605. With the passive power line communication module 650, communication signals can be sent between the refrigerated container and a remote device that collects data from the refrigerated container.

FIG. 6D provides another example of power line communication, but using an active power line communication module 660. The active power line communication module 660 comprises two signal transformers 662 and 664 that are coupled via capacitors to opposite sides of the breaker 605. The active power line communication module 660 also comprises a transceiver 665 located between the two signal transformers 662 and 664 and coupled via capacitors to the two signal transformers. The transceiver can be used to boost and re-shape the communication signal for better performance reliability. However, the active power line communication module 660 requires power to operate. Power to support the power line communications can be provided by a battery source that may be available on the refrigerated container or by an alternate power source such as the 24 volt DC power source 610.

The power line communication modules 650 and 660 illustrated in FIGS. 6C and 6D are only examples and those of skill in the field will recognize that the power line communication modules can be configured in other ways to achieve communication with the refrigerated container or other device when the breaker is open. For example, the power line communication modules can be configured to different phase conductors other than the A and B phases shown in FIGS. 6C and 6D and the modules can be coupled at other locations on either side of the breaker.

Figure 7:
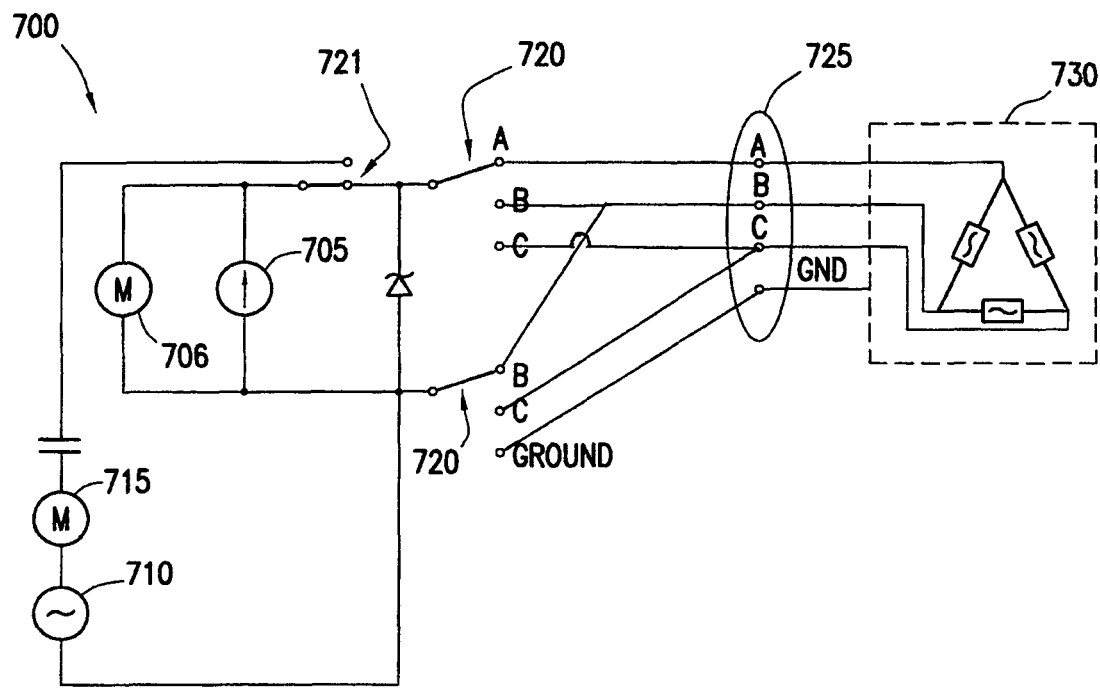
FIG. 7 is a schematic diagram showing detection circuits that can be used in an improved receptacle in accordance with an example embodiment of the present disclosure.
Figure 8A:
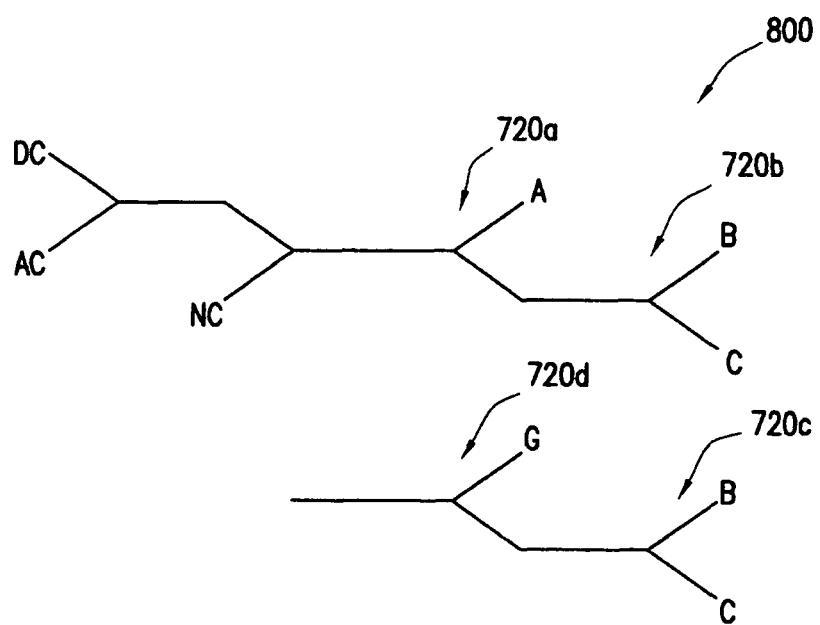
FIG. 8A is a schematic diagram showing relays that can be used in an improved receptacle in accordance with an example embodiment of the present disclosure.

The microcontroller described herein that enables the improved receptacle also comprises at least one processor and detection circuits and relays in order to perform the testing and monitoring. FIG. 7 illustrates an example of the detection circuits that can be implemented that permit the microcontroller to perform the necessary testing. In the example shown in FIG. 7, a DC power source 705 can be applied to the different combinations of the conductors A, B, C, and ground in the plug or connector 725 in order to measure with meter 706 whether there are any faults between the different conductors. The plug 725 is shown in FIG. 7 coupled to a load 730. The different combinations of the conductors A, B, C and ground can be tested using the relay switches 720. For example, actuating the different relay switches permits testing for short circuits between A and B; A and C; and B and C. FIG. 8A shows an example 800 of the relay switches, shown in greater detail as 720a, 720b, 720c, and 720d, being implemented using single pole double throw switches. The relay switches shown in FIG. 8A are shown with the contact arm in both positions for illustrative purposes, however, those skilled in this field would understand that, when implemented, the contact arm for each relay would only be in a single position at a given time. Alternate embodiments can implement the relay switches 720 using other arrangements of switches than those shown in FIG. 8A. The detection circuit 700 shown in FIG. 7 also includes an AC power source 710 and a meter 715 for detecting ground faults between each of conductors A, B, C and the ground wire. FIG. 8B provides a table listing examples of the different testing functions that the microcontroller can perform.

Those of skill in this field will recognize that the circuits illustrated in FIGS. 5-8B are non-limiting examples. In alternate embodiments, the circuits may take different arrangements or use different components in order for the microcontroller to perform the necessary testing.

Figure 9:
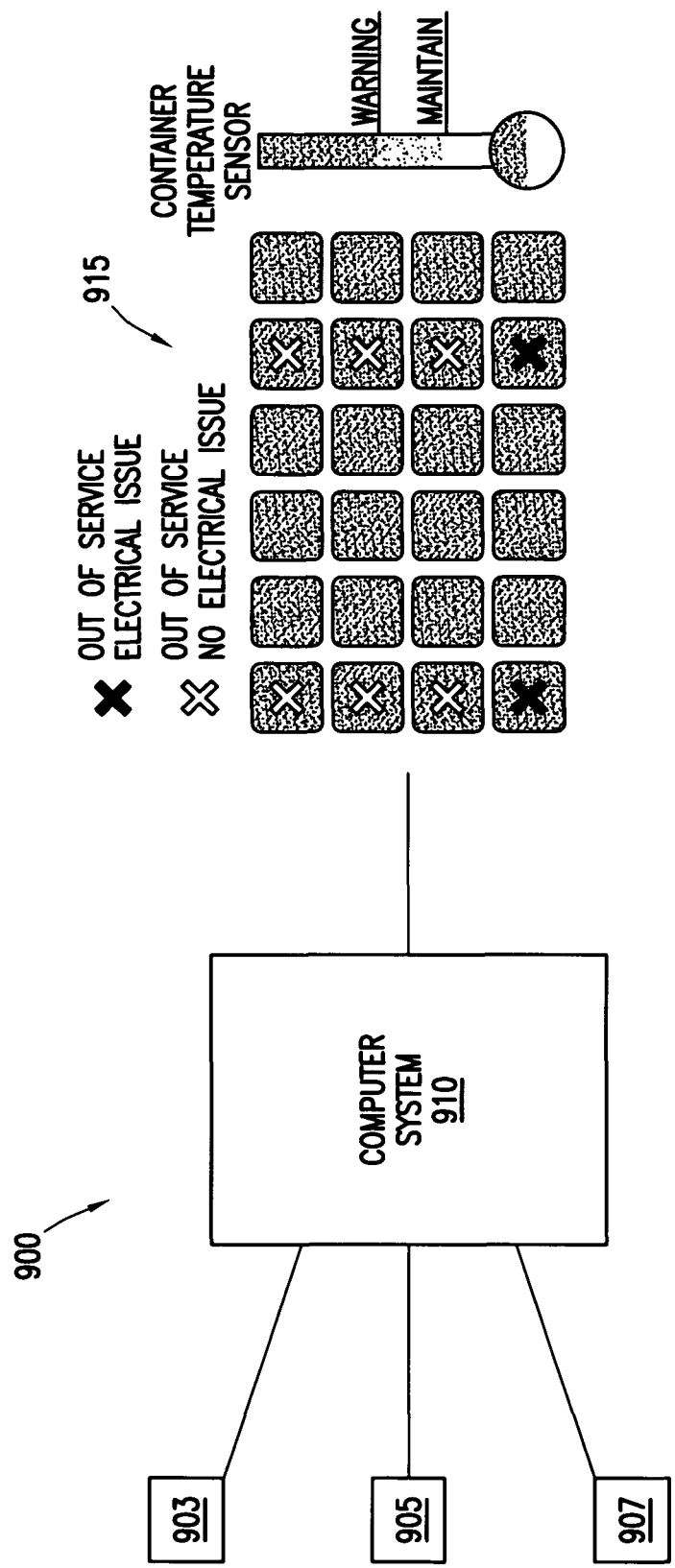
FIG. 9 illustrates the use of an improved receptacle in a system for monitoring containers at a port in accordance with an example embodiment of this disclosure.
Figure 10:
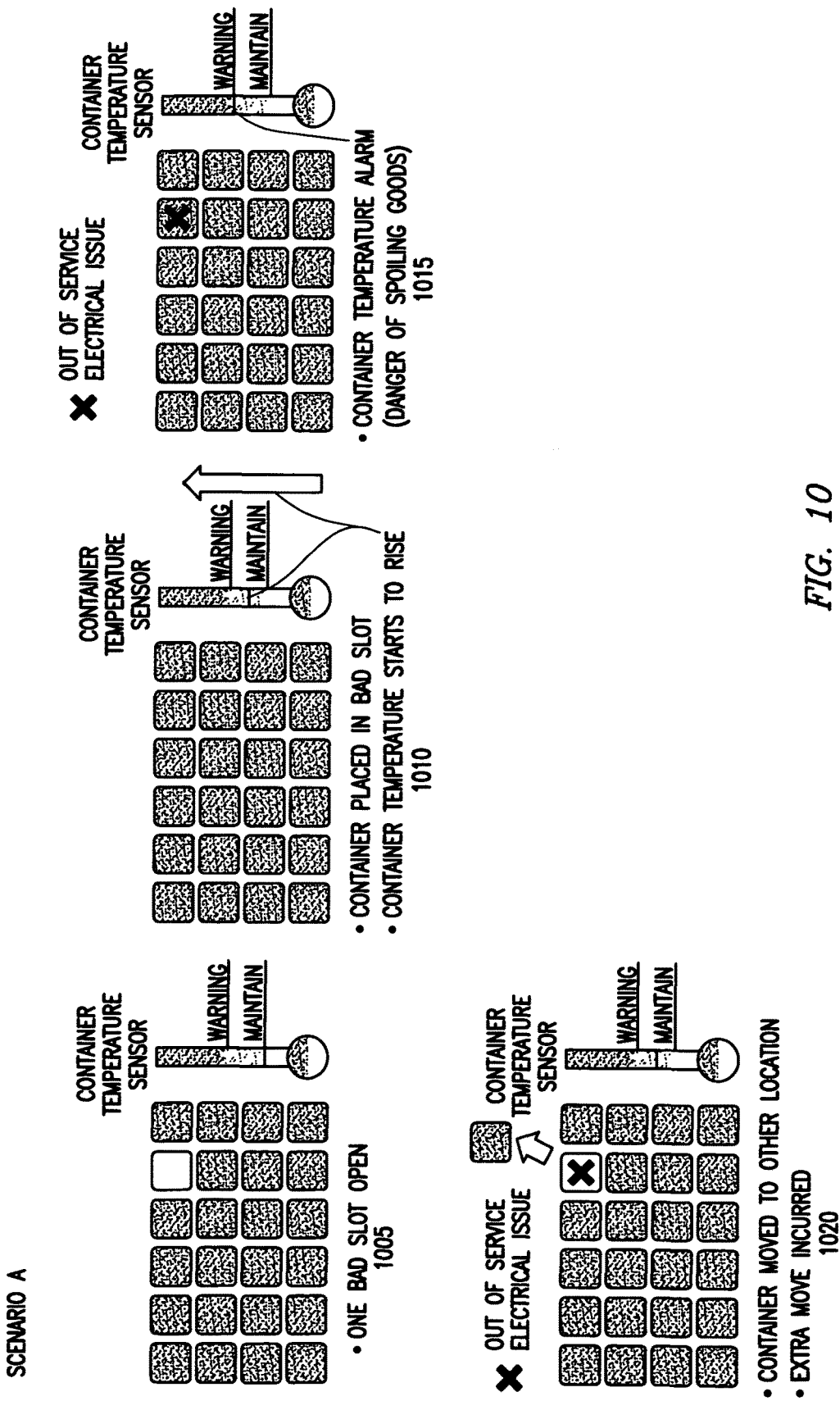
FIG. 10 illustrates the use of an improved receptacle in a system for monitoring containers at a port in accordance with an example embodiment of this disclosure.
Figure 11:
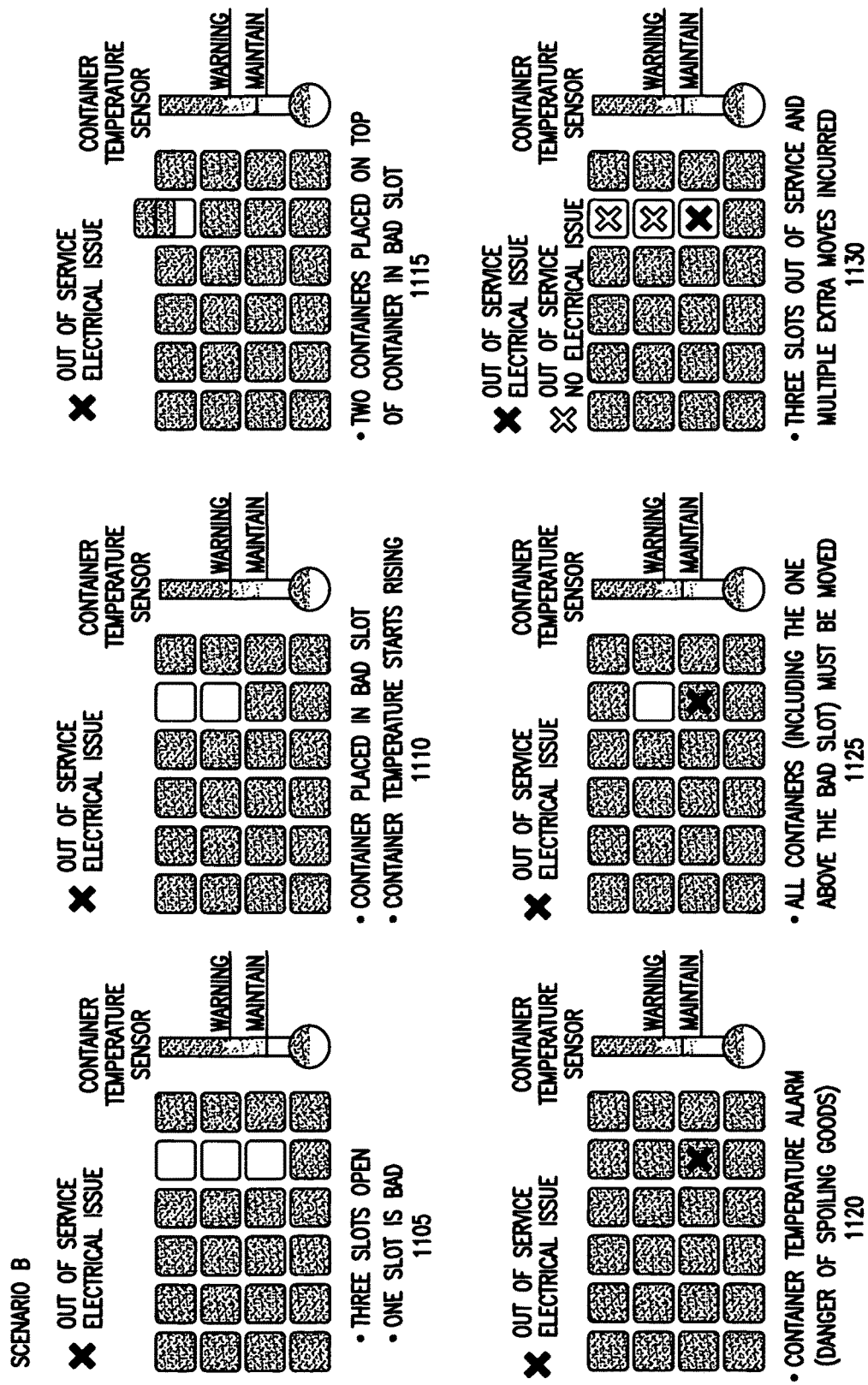
FIG. 11 illustrates the use of an improved receptacle in a system for monitoring containers at a port in accordance with an example embodiment of this disclosure.

Referring now to FIGS. 9 through 11, additional benefits of the improved receptacle disclosed herein are described. The benefits and features described in the following figures can also be applied to any of the embodiments described herein including those implementing a switch and/or indicator instead of a breaker. In particular, in addition to the safety features offered with the improved receptacle having a microcontroller as described herein, the microcontroller can be used to perform ongoing monitoring and management of devices connected to each of the improved receptacles. In the example of a port where many shipping containers are stored, the improved receptacle can be used to monitor the shipping containers connected to the receptacles and manage the movements of containers within the port.

Moreover, the microcontroller coupled to the receptacle can provide information with respect to the receptacle and the circuit breaker. This monitoring of the receptacle and circuit breaker is advantageous for several reasons. For example, if a receptacle was not currently being used, but had been damaged in the past, the port operator could determine that the receptacle or circuit breaker were damaged before attempting to connect a container to that receptacle.

Referring to the example illustrated in FIG. 9, a system 900 for gathering information from an array of microcontrollers located at receptacles is illustrated. Using the improved receptacle described herein, the microcontroller can communicate information concerning the status of power being supplied to containers and the status of the receptacle, the circuit breaker, the connector, the power cord, or any electrical equipment, including the load, located downstream of the receptacle. An array of microcontrollers, such as microcontrollers 903, 905, and 907, can communicate the information using one or more wired or wireless communication protocols to a central computer system 910 used to manage the location at which a multitude of containers are located, such as a port or distribution center. The central computer system can collect information from the microcontrollers 903, 905, and 907, which are coupled to each receptacle. The collected information can relate to the operation and status of the receptacle and the electrical equipment at each receptacle. As shown in FIG. 9, the central computer system 910 can provide a display 915 of information concerning receptacles or electrical equipment that is not in service. For example, receptacles that are not available for use can be marked with an "X", whereas available receptacles can be designated with an empty box. This information can be very useful in a busy port or distribution center where space is at a premium and reefer racks may not be available for storing shipping containers. The monitoring information is also useful to a port or distribution center in that it can be used to minimize the number of times a shipping container is moved. Each move of a shipping container has an associated cost, so the ability to efficiently manage the movement of shipping containers based on the monitoring information collected from the improved receptacles assists the port operator in reducing costs.

FIGS. 10 and 11 illustrate other examples where information gathered from the microcontroller installed at each receptacle can be used to manage the shipping containers in a port. FIG. 10, comprising states 1005 through 1020, shows an example where a reefer rack has been identified as being out of service, perhaps due to faulty electrical equipment such as detection by the microcontroller of a tripped breaker or detection of a fault on the power lines coming in to the receptacle. The particular reefer rack can be marked as unavailable within the port's central computer system so that other shipping containers are not stored at that location. FIG. 11, comprising states 1105 through 1130, shows an example where the information gathered from microcontrollers located at receptacles is particularly useful in a port that uses reefer racks wherein containers are stacked on top of each other. As shown in FIG. 11, a reefer rack with defective electrical equipment will render the slots above that reefer rack also unavailable and this information can be easily gathered and provided to a user via the port's central computer system that is receiving information from each of the microcontrollers installed at the receptacles at each reefer rack.

Those in the field will recognize that the examples discussed in connection with FIGS. 9-11 of managing a port using the improved receptacles can be applied to other contexts. For example, a large industrial facility may have many enclosures with receptacles such as the ones shown in FIG. 4A. Implementing the improved receptacle described herein at each enclosure within the industrial facility can allow a central monitoring system to gather information concerning the status of each receptacle within each enclosure via the communication capabilities of the microcontroller.

FIGS. 12 through 16 provide yet another example of an advantage offered with the improved receptacle. FIGS. 12 through 16 illustrate an example of an architecture and a method for measuring energy use at each receptacle. Using the improved receptacle to measure energy usage at an array of receptacles can be useful in a variety of environments. Referring to the example of refrigerated shipping containers, energy use per refrigerated container is covered in overhead cost to the cargo owner (at a flat price). At the same time, refrigerated containers are becoming more efficient (more efficient refrigeration units, better insulation, etc.), but the cargo owners are seeing no benefit from the use of the efficient containers—they are billed the same as cargo owners that use old, inefficient containers that consume more energy. The improved receptacle described herein can support a metering solution, and therefore can provide power monitoring and capture energy use per container. The metering solution using the improved receptacle provides the platform for sending metering information to a billing system that can bill each container owner for the container's individual energy consumption.

Figure 12:
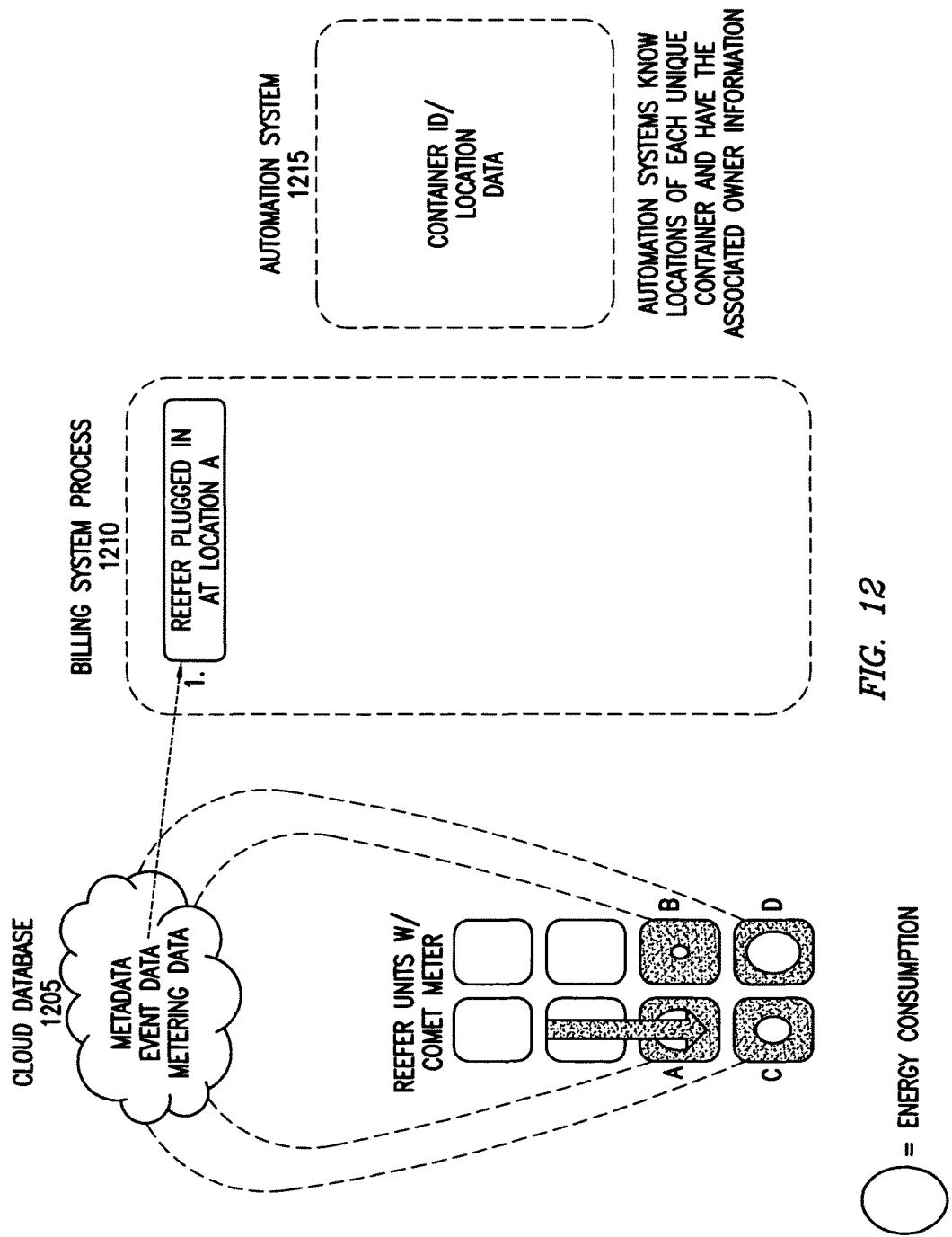
FIGS. 12-16 illustrate an architecture and process for energy metering and billing in accordance with an example embodiment of this disclosure.

Referring to FIG. 12, an example architecture for such a metering system is illustrated. FIG. 12 shows loads A, B, C, and D with varying levels of energy consumption. While in this example loads A, B, C and D represent refrigerated shipping containers, in other embodiments the loads can be other types of devices. Each load illustrated in the example in FIG. 12 has an associated receptacle with a microcontroller. Also associated with each receptacle is a metering device for measuring the amount of energy consumed at each receptacle over a defined time. The metering device can be implemented as part of the microcontroller or as a separate component that is in communication with the microcontroller. The microcontroller collects the energy consumption data from the metering device and communicates the data via a wired or wireless connection to a remote computing system represented by the cloud database 1205. The remote computing system 1205 can execute a billing process 1210. As illustrated in the example in FIG. 12, the billing process can begin when a refrigerated container or other load is plugged into a receptacle.

Figure 13:
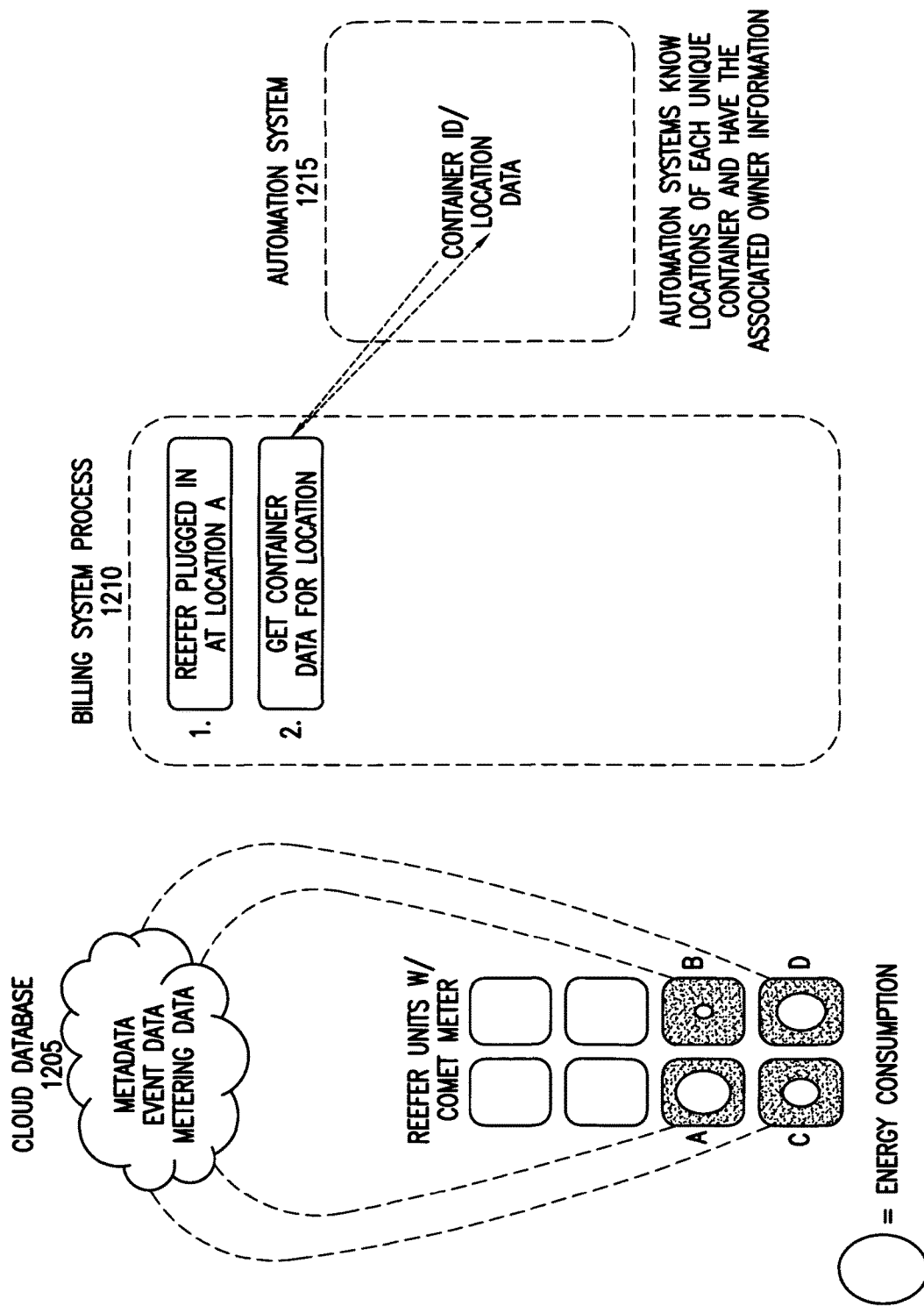
Figure 14:
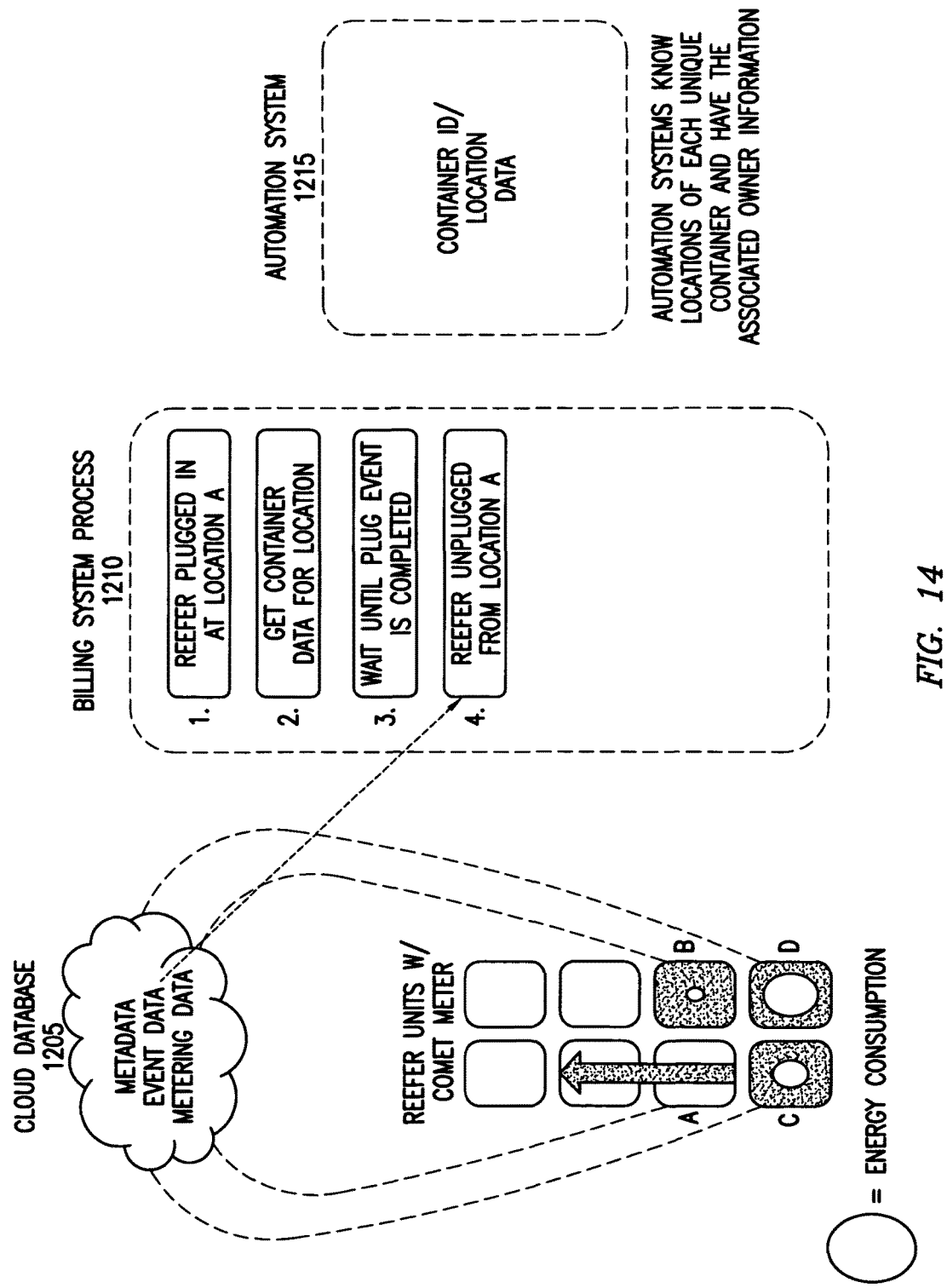
Figure 15:
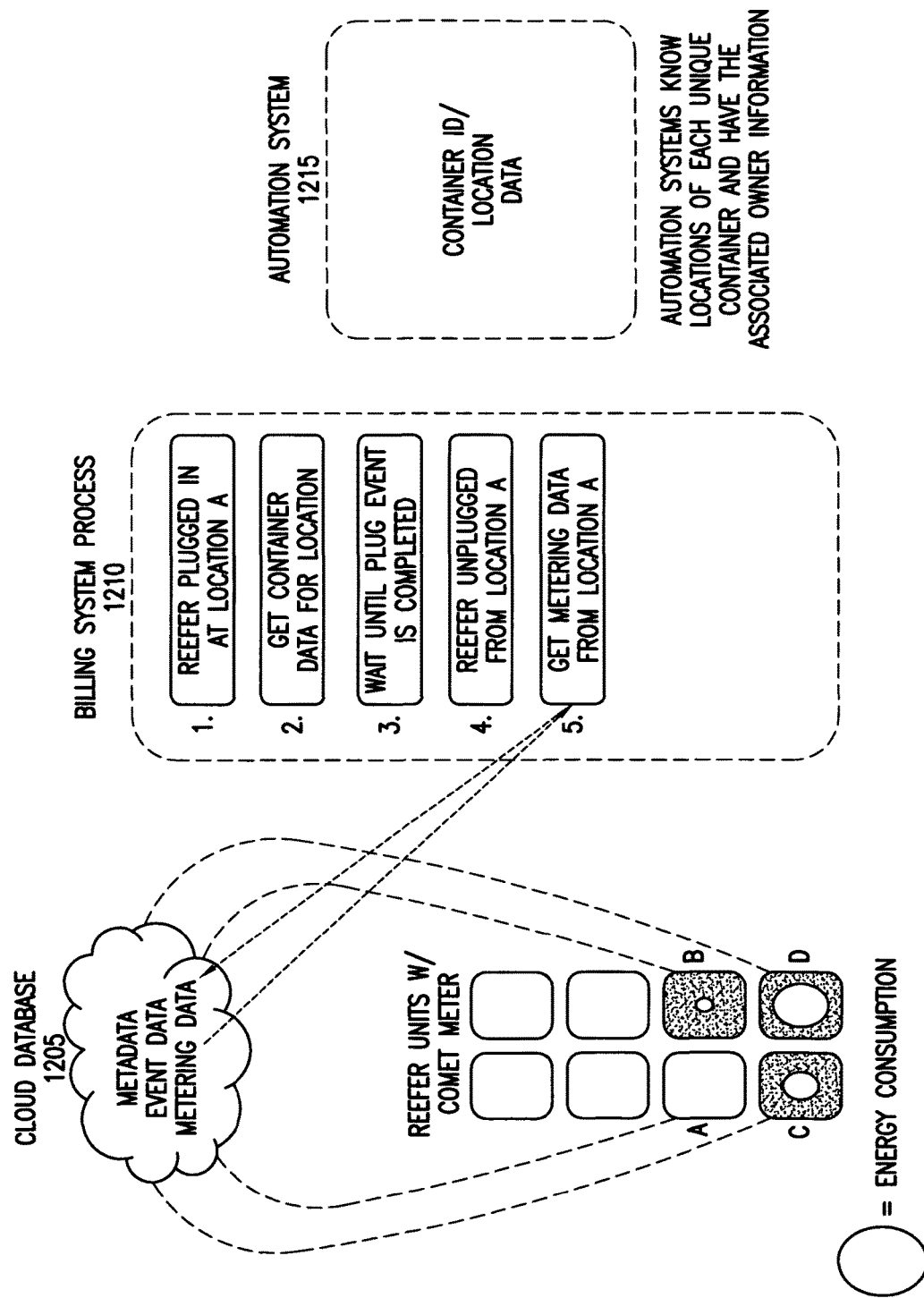
Figure 16:
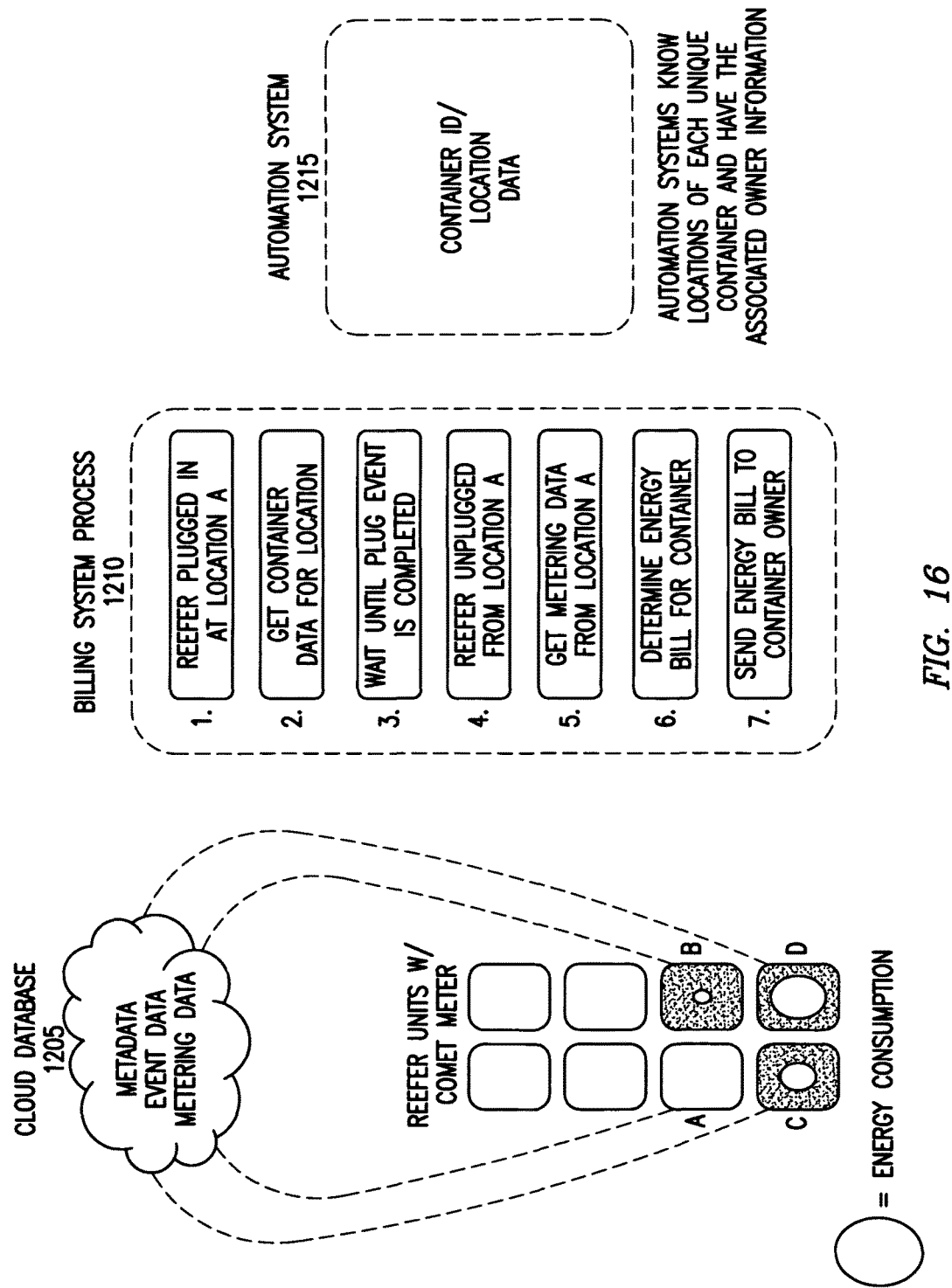

As shown in FIG. 13, the next step of the example billing system process includes obtaining data about the container from an automation system 1215 that stores the container identification and location information. As shown in FIGS. 14 and 15, when the refrigerated container is unplugged from the receptacle, the next step of the billing process is initiated and the data showing the energy consumed by the container is used to complete the billing process. Lastly, in FIG. 16, the bill for the energy consumed by the container is determined and sent to the owner of the container. Those in the field will recognize that the architecture and method shown in FIGS. 12 through 16 are merely examples and that other methods for metering and billing can be accomplished with the improved receptacle disclosed herein.

Although the inventions are described with reference to example embodiments, it should be appreciated by those skilled in the art that various modifications are well within the scope of the invention. From the foregoing, it will be appreciated that an embodiment of the present invention overcomes the limitations of the prior art. Those skilled in the art will appreciate that the present invention is not limited to any specifically discussed application and that the embodiments described herein are illustrative and not restrictive. From the description of the example embodiments, equivalents of the elements shown therein will suggest themselves to those skilled in the art, and ways of constructing other embodiments of the present invention will suggest themselves to practitioners of the art. Therefore, the scope of the present invention is not limited herein.

What is claimed is:

1. An interlocking socket for coupling to a connector of a load, the interlocking socket comprising:
   a receptacle configured to receive the connector;
   a microcontroller coupled to the receptacle, the microcontroller operable for testing for one or more faults in the connector, a conductor coupling the load and the connector, or the load;
   a breaker coupled to the receptacle and the microcontroller; and
   a signal transformer coupled on a first side of the interlocking socket at a power cord conductor and coupled to a second side of the interlocking socket at a line conductor, wherein the breaker is located between the first side and the second side of the interlocking socket.

2. The interlocking socket of claim 1, wherein the one or more faults include a bolted fault, a ground fault, one or more open phases, and an electrical arcing condition.

3. The interlocking socket of claim 1, wherein the breaker is coupled to the receptacle and the microcontroller, wherein the microcontroller is further operable for preventing power from being delivered from the breaker to the connector when a result of the testing performed indicates an unsafe condition.

4. The interlocking socket of claim 1, wherein the microcontroller is operable for testing one or more of:
   a ground fault circuit interrupter within the breaker;
   that the connector is grounded;
   a temperature within the receptacle; and
   that the connector is completely inserted into the receptacle.

5. The interlocking socket of claim 1, wherein the microcontroller is mounted in one of the following positions: to the exterior of the breaker, within the breaker, within an enclosure surrounding the interlocking socket, or to the exterior of the enclosure.

6. The interlocking socket of claim 1, further comprising an indicator of a result of the testing performed by the microcontroller, the indicator being visual, audible, or both visual and audible.

7. The interlocking socket of claim 1, further comprising a power line communication module for transmitting a result of the testing performed by the microcontroller to a remote computer system, the power line communication module comprising the signal transformer and a pair of capacitors.

8. The interlocking socket of claim 1, wherein the microcontroller is further operable for:
   monitoring the breaker, the connector, the conductor, and the load after the breaker is closed; and
   opening the breaker if a fault is detected, the fault being one or more of a bolted fault, a ground fault, one or more open phases, and an electrical arcing condition.

9. The interlocking socket of claim 1, wherein the microcontroller performs the following steps:
   measuring an amount of energy consumed by the load during a time period; and
   transmitting the measured amount of energy consumed to a remote computer system that comprises a billing system.

10. A switching device for coupling to a load, the switching device comprising:
    a line conductor;
    a power cord conductor;
    a breaker disposed between the line conductor and the power cord conductor;
    a microcontroller coupled to the breaker and the power cord conductor, the microcontroller operable for testing for one or more faults in the power cord conductor or the load coupled to the power cord conductor; and
    a power line communication module comprising a signal transformer, the signal transformer coupled on a first side of the switching device to the power cord conductor and coupled on a second side of the switching device to the line conductor, the signal transformer for transmitting communication signals between the load and a remote device.

11. The switching device of claim 10, wherein the one or more faults include a bolted fault, a ground fault, one or more open phases, and an electrical arcing condition.

12. The switching device of claim 10, wherein the microcontroller is mounted in one of the following positions: to the exterior of the switching device, within an enclosure surrounding the switching device, or to the exterior of the enclosure.

13. The switching device of claim 10, further comprising an indicator of a result of the testing performed by the microcontroller, the indicator being visual, audible, or both visual and audible.

14. An indicator device for coupling to a load, the indicator device comprising:
    a line conductor;
    a power cord conductor;
    a breaker disposed between the line conductor and the power cord conductor;
    a microcontroller coupled to the breaker and the power cord conductor, the microcontroller operable for testing for one or more faults in the power cord conductor or the load coupled to the power cord conductor;
    a power line communication module comprising a signal transformer, the signal transformer coupled on a first side of the indicator device to the power cord conductor and coupled on a second side of the indicator device to the line conductor, the signal transformer for transmitting communication signals between the load and a remote device; and
    an indicator for providing a result of the testing performed by the microcontroller, the indicator being visual, audible, or both visual and audible.

15. The indicator device of claim 14, wherein the one or more faults include a bolted fault, a ground fault, one or more open phases, and an electrical arcing condition.

16. The indicator device of claim 14, wherein the microcontroller is mounted in one of the following positions: to the exterior of the indicator device, within an enclosure surrounding the indicator device, or to the exterior of the enclosure.

17. The indicator device of claim 14, wherein the power line communication module further comprises a second signal transformer and a transceiver disposed between the signal transformer and the second signal transformer.

* * * * *